United States Patent [19]
Aoki

[11] Patent Number: 5,263,246
[45] Date of Patent: Nov. 23, 1993

[54] BUMP FORMING METHOD

[75] Inventor: Tsutomu Aoki, Tokyo, Japan

[73] Assignee: NEC Corporation, Tokyo, Japan

[21] Appl. No.: 835,378

[22] Filed: Feb. 14, 1992

[30] Foreign Application Priority Data

Feb. 20, 1991 [JP] Japan .................. 3-047490

[51] Int. Cl.$^5$ .................................. H01R 9/06
[52] U.S. Cl. ........................ 29/843; 228/1.1;
228/4.5; 228/179.1; 437/183
[58] Field of Search ............... 29/827, 843; 228/1.1,
228/4.5, 179; 437/183

[56]  References Cited

U.S. PATENT DOCUMENTS

| 3,460,238 | 8/1969 | Christy et al. | 228/1.1 X |
|---|---|---|---|
| 3,689,983 | 9/1972 | Eltzroth et al. | 228/4.5 X |
| 3,718,272 | 2/1973 | Eltzroth et al. | 228/1.1 X |
| 3,747,198 | 7/1973 | Benson et al. | 228/1.1 X |
| 3,954,217 | 5/1976 | Smith | 228/1.1 X |
| 4,597,520 | 7/1986 | Biggs | 228/111 |
| 4,765,526 | 8/1988 | Sato | 228/4.5 |
| 4,771,930 | 9/1988 | Gillotti et al. | 228/4.5 X |
| 4,776,509 | 10/1988 | Pitts et al. | 228/1.1 X |
| 4,955,523 | 9/1990 | Carlomagno et al. | 29/840 X |
| 5,018,658 | 5/1991 | Farassat | 228/4.5 |
| 5,116,228 | 5/1992 | Kabeshita et al. | 29/840 X |
| 5,118,370 | 6/1992 | Ozawa | 29/840 X |

FOREIGN PATENT DOCUMENTS

| 62-115748 | 5/1987 | Japan | 437/183 |
|---|---|---|---|
| 63-173345 | 7/1988 | Japan | 437/183 |
| 1-73626 | 3/1989 | Japan | 437/183 |
| 1-286450 | 11/1989 | Japan | 437/183 |
| 2-12919 | 1/1990 | Japan | 437/183 |

Primary Examiner—Carl J. Arbes
Attorney, Agent, or Firm—Burns, Doane, Swecker & Mathis

[57]  ABSTRACT

In order to minimize the size of an aluminum pad in a method of forming a bump, a metal wire is wedge-bonded on the aluminum pad, a necessary amount of the wire is left on the aluminum pad, and the metal wire is disconnected by a clamp. The width of a collapsed portion of the wire on the aluminum pad can be reduced to 1.5 times or less the wire diameter.

7 Claims, 4 Drawing Sheets

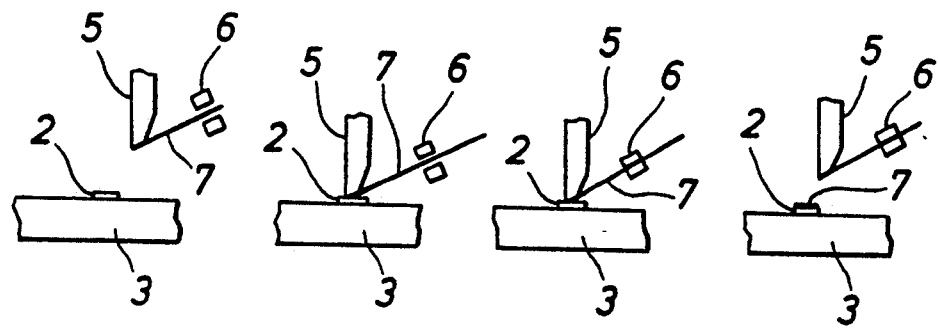
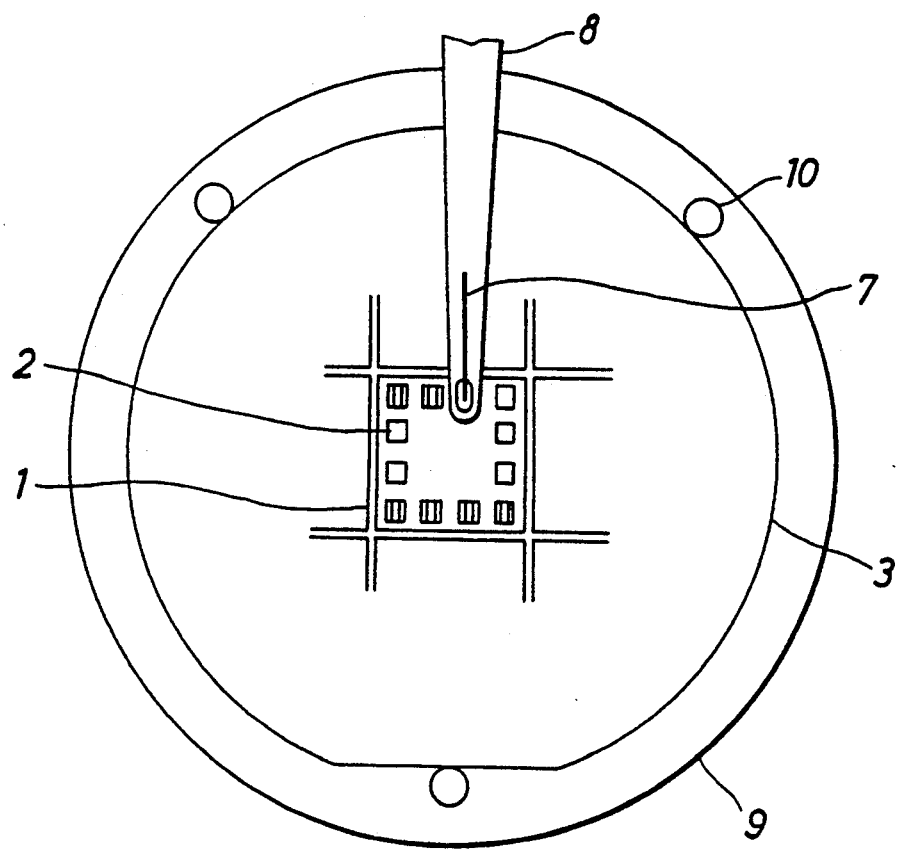

BUMP FORMING METHOD

BACKGROUND OF THE INVENTION

1. Field of the Invention

The present invention relates to a method of forming a bump for use on a TAB (Tape Automated Bonding) wafer and, more particularly, to a bump forming method compatible with a narrow-pitch inner lead.

2. Description of the Prior Art

A conventional method of forming a bump of this type has been practiced to form a gold bump for gilding an electrode on a wafer or a copper bump for copper-plating an electrode on a wafer, but the material cost is disadvantageously high. A ball bump method utilizing a standard gold wire bonder is proposed as a technique for reducing the material cost. FIG. 1 is a plan view showing a state of a ball bump, and FIG. 2 is a side view thereof. A ball bump is formed such that a ball is formed at the tip of a gold wire by a spark rod of a bonder, a gold ball 11 is bonded to an aluminum pad 2 on a wafer 3 under pressure, and the wire is then disconnected. In this method, since a bump formation step can be omitted in a diffusion step, turn-around time (TAT) can be shortened, and wafers having different sizes can be processed, thus providing versatility. The ball bump method has recently received a great deal of attention because the material cost is lower than that of other bump formation methods.

Since a ball 11 is formed at the tip of a gold wire in this conventional ball bump method, the diameter of the gold ball 11 at the time of its formation is about 2.5 times the diameter of the wire. In addition, when the ball 11 is bonded on an aluminum pad 2 under pressure, the diameter D of the collapsed portion of the ball 11 becomes about 3.5 times the diameter d of the wire, as shown in FIGS. 1 and 2. Although the pitch between aluminum electrodes is to be reduced along with the advance of chip micropatterning, the minimum pitch is limited to about 120 μm due to the above reason. To solve this problem, the wirediameter may be reduced. However, a method of forming a ball at the tip of a thin wire requires difficult control of the spark voltage and suffers from poor stability. In addition, the cost performance factor limits the wire diameter of a thin wire to a minimum of 20 μm. In this case, a ball formed at the tip of the thin wire and collapsed on a pad has a diameter of about 70 μm and the limitation of the narrow pitch using the ball bump becomes about 100 μm.

SUMMARY OF THE INVENTION

It is an object of the present invention to provided a bump forming method which enables reduction and high performance of a semiconductor chip by miniturization of an aluminum pad and attainment of narrow pitch.

In order to achieve the above object of the present invention, there is provided a method of forming a bump on a TAB wafer, comprising wedge-bonding a wire on an aluminum pad, performing bonding by a necessary amount under pressure, and disconnecting the wire by a clamp.

An elongated aluminum pad is used, a wire is wedge-bonded within the aluminum pad, and a wire portion is used as a bump.

Since the metal wire is wedge-bonded on the aluminum pad, bonding is performed by a necessary amount under pressure, and the metal wire is disconnected by the clamp, the width of the collapsed ball on the aluminum pad can be reduced to about 1.5 times or less the wire diameter.

BRIEF DESCRIPTION OF THE DRAWINGS

FIGS. 5(a) to 5(d) are views showing the steps in forming a bump;

FIG. 6 is a plan view showing an apparatus according to the present invention.

DETAILED DESCRIPTION OF THE PREFERRED EMBODIMENTS

Figure 1:
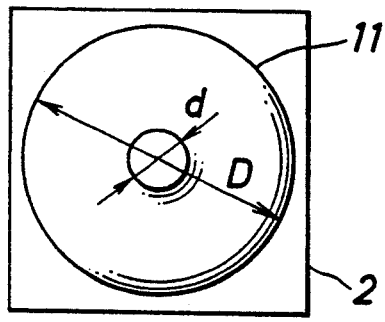
FIG. 1 is a plan view showing an aluminum pad in a conventional method of forming a ball bump.
Figure 2:
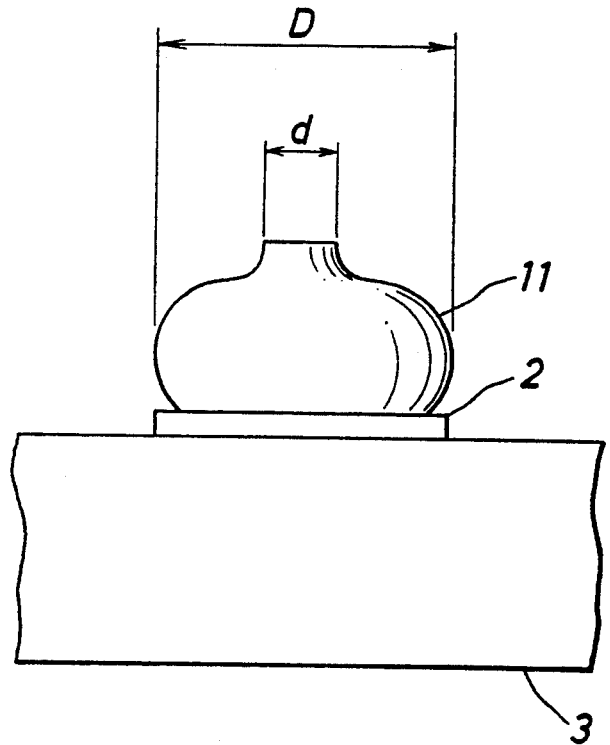
FIG. 2 is a side view of the conventional aluminum pad.
Figure 3:
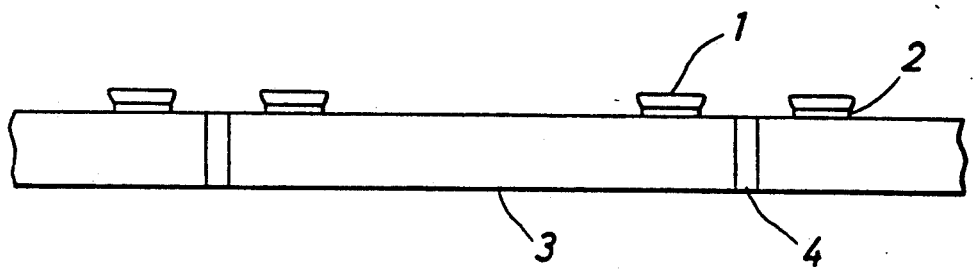
FIG. 3 is a sectional view showing a wafer after bumps are formed according to the first embodiment of the present invention.
Figure 4:
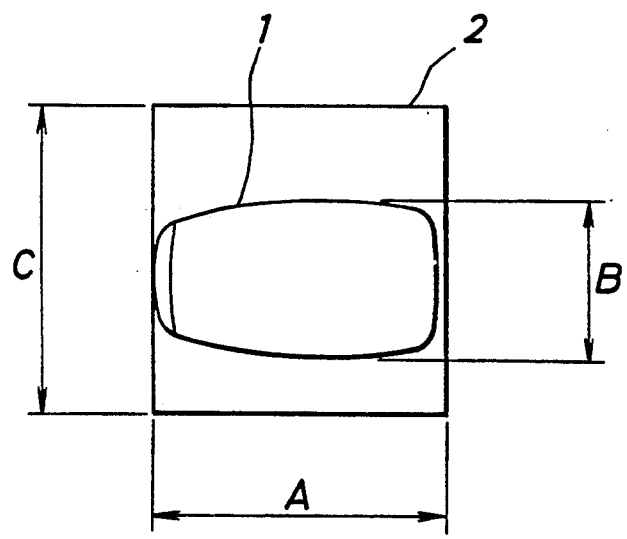
FIG. 4 is a plan view showing an aluminum pad after a bump is formed.

FIG. 3 is a sectional view showing a wafer after bumps are formed according to the first embodiment of the present invention, FIG. 4 is a plan view showing one aluminum pad upon formation of a corresponding bump, FIGS. 5(a) to 5(d) are views showing the steps in forming the bump according to the present invention, and FIG. 6 is a plan view showing an apparatus according to the present invention.

As shown in FIGS. 5(a) to 5(d), a tip portion of a wire 7 is wedge-bonded on an aluminum pad 2 on a wafer 3 by using a wedge 5. Upon completion of wedge bonding on the pad 2, the wire 7 is clamped by a clamp 6 and moved upward, and a collapsed wire portion shown in FIG. 4 is left on the aluminum pad 2. Reference numeral 4 denotes a dicing line. A length A and a width B of a collapsed portion can be limited to about twice and 1.5 times or less a wire diameter d, respectively, due to wedge bonding. If a wire having a diameter of 20 μm is used, the length of the side of the square aluminum pad 2 can be set to be about 40 μm. The pitch between the aluminum pads 2 can be reduced such that the inner lead pitch is reduced to 100 μm or less.

FIG. 6 shows a state wherein a bump is being formed on the wafer 3 by means of wedge bonding. An apparatus in FIG. 6 includes a US (ultrasonic) horn (transducer) 8, an X-Y-θ stage 9 for aligning a bonding direction, and positioning rollers 10 to perform wedge bonding.

Figure 7:
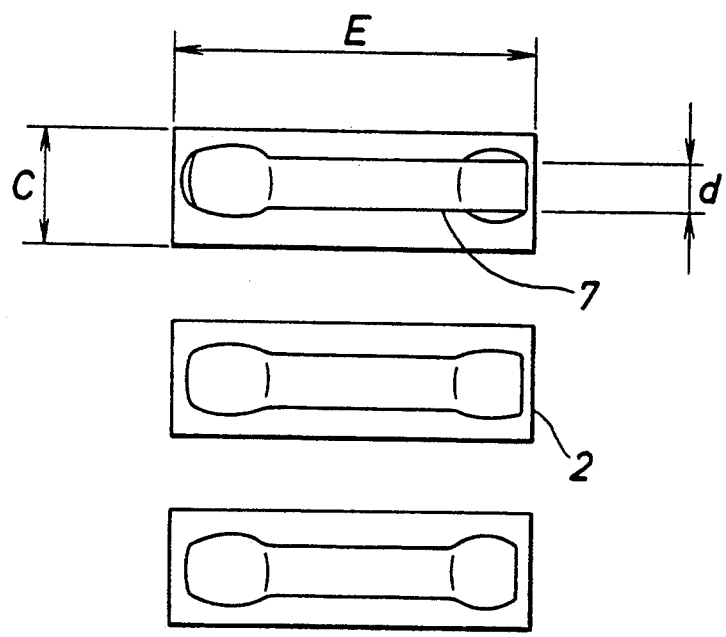
FIG. 7 is a plan view showing an aluminum pad after bumps are formed according to the second embodiment.

FIG. 7 shows the second embodiment of the present invention. In this embodiment, elongated pads 2 are used to reduce the pitch therebetween. Wedge bonding is performed within each aluminum pad 2. In this case, a bump is constituted not by a collapsed portion but a portion of a wire 7. When bonding is performed within an aluminum pad using a general ball bonder, a raised portion is inevitably formed the wire, and bumps cannot have an equal height. In wedge bonding, since it is easy to control the wire height in the downward direction, the second embodiment can be easily achieved. A length E of the aluminum pad can be limited to about 160 μm if the wire diameter d is given as 20 μm.

As has been described above, according to the present invention, a metal wire is wedge-bonded on an aluminum pad, and a necessary amount of the wire can be left on the aluminum pad. The size of the aluminum pad and the pitch between the pads can be smaller than those in conventional bump formation methods. Therefore, the size of a semiconductor chip can be reduced, and the semiconductor chip can have high performance.

What is claimed is:

1. A bump forming method, comprising the steps of: wedge-bonding under pressure a portion of a wire to a metal pad located on a wafer by means of a wedge with an ultrasonic horn, said portion of said wire forming a bump on said metal pad and said bump being collapsed after completion of the wedge bonding, and disconnecting said wire from said portion of said wire by moving a clamping means for clamping said wire upward.

2. The method according to claim 1, wherein said wafer is a TAB wafer.

3. The method according to claim 1, wherein said metal pad is an aluminum pad.

4. The method according to claim 1, further comprising the step of: reducing the inner lead pitch between each said metal pad.

5. The method according to claim 4, wherein said inner lead pitch is reduced to less than or equal to 100 $\mu$m.

6. A bump manufactured by the process of wedge-bonding under pressure a portion of a wire to a metal pad located on a wafer by means of a wedge with an ultrasonic horn, said portion of said wire forming a bump on said metal pad and said bump being collapsed after completion of the wedge-bonding, and disconnecting said wire from said portion of said wire by moving a clamping means for clamping said wire upward, wherein a length of a collapsed portion of said wire is limited to or less than 2.0 times the wire diameter and a width of the collapsed portion of said wire is limited to or less than 1.5 times the wire diameter.

7. A bump forming method, comprising the steps of: wedge-bonding under pressure a portion of a wire to an elongated metal pad located on a wafer by means of a wedge with an ultrasonic horn, said portion of said wire forming a bump on said elongated metal pad and said bump being collapsed after completion of the wedge-bonding and including a non-collapsed wire portion of said portion of said wire, and disconnecting said wire from said portion of said wire by moving a clamping means for clamping said wire upward.

* * * * *